US011706875B2

(12) United States Patent
Shin et al.

(10) Patent No.: US 11,706,875 B2
(45) Date of Patent: Jul. 18, 2023

(54) UNIT UNLOADING SYSTEM (71) Applicant: Rokko Systems Pte Ltd, Singapore (SG)

(72) Inventors: Yun Suk Shin, Singapore (SG); Jong Jae Jung, Singapore (SG); Deok Chun Jang, Singapore (SG)

(73) Assignee: Rokko Systems Pte Ltd, Singapore (SG)

( * ) Notice: Subject to any disclaimer, the term of this patent is extended or adjusted under 35 U.S.C. 154(b) by 735 days.

(21) Appl. No.: 16/629,514

(22) PCT Filed: Aug. 7, 2018

(86) PCT No.: PCT/SG2018/050401
§ 371 (c)(1),
(2) Date: Jan. 8, 2020

(87) PCT Pub. No.: WO2019/032048
PCT Pub. Date: Feb. 14, 2019

(65) Prior Publication Data
US 2020/0170119 A1 May 28, 2020

(30) Foreign Application Priority Data
Aug. 7, 2017 (SG) .............. 10201706437V (51) Int. Cl.
*H05K 3/00* (2006.01)
*H05K 13/02* (2006.01)
(Continued)

(52) U.S. Cl.
CPC ............. *H05K 3/26* (2013.01); *H05K 3/0052* (2013.01); *H05K 3/227* (2013.01); *H05K 13/028* (2013.01);
(Continued)

(58) Field of Classification Search
CPC ...... H05K 3/26; H05K 13/02; H05K 13/0084; H05K 13/028; H05K 2203/0228;
(Continued)

(56) References Cited
U.S. PATENT DOCUMENTS

| 4,763,811 A | * | 8/1988 | Mae ..................... H05K 13/02 221/11 |
| 6,019,212 A | * | 2/2000 | Takahashi ............ H05K 13/028 198/397.03 |
| 2002/0182308 A1 | | 12/2002 | Lee et al. |

FOREIGN PATENT DOCUMENTS

| CN | 106793542 A1 | 5/2017 |
| GB | 2154434 A1 | 9/1985 |
| JP | 2008153316 A * | 7/2008 |

OTHER PUBLICATIONS

W. Wang, M. Lamb and I. J. Busch-Vishniac, "An automated loading and unloading system for a maglev wafer transport path," in IEEE Transactions on Semiconductor Manufacturing, vol. 6, No. 3, pp. 276-279, Aug. 1993. (Year: 1993).*

(Continued)

*Primary Examiner* — A. Dexter Tugbang
(74) *Attorney, Agent, or Firm* — Dicke, Billig & Czaja, PLLC (57) ABSTRACT

An IC unit unloading system including a chute and a drawer. The chute has a plurality of channels each arranged to receive a unit. The drawer is arranged to move along the chute and has a gate with a unit contact face proximate a top surface of the chute. The contact face is arranged to draw the units along the respective channel as the drawer moves along the chute, and to allow the units to slide laterally across the contact face from a first pitch of each channel to a second pitch. A method for washing a plurality of PCB units, the method comprising the steps of: receiving a plurality of PCB units, said PCB units arranged with a bump (Continued)

face projecting downwards; washing the bump face of the PCB units, then; flipping the PCB units so as to project the ball face downwards, then; washing the ball face.

5 Claims, 9 Drawing Sheets

(51) Int. Cl.
*H05K 3/26* (2006.01)
*H05K 3/22* (2006.01)
*H05K 13/00* (2006.01)

(52) U.S. Cl.
CPC ..... *H05K 13/0061* (2013.01); *H05K 13/0084* (2013.01); *H05K 13/02* (2013.01); *H05K 2203/0228* (2013.01); *H05K 2203/0766* (2013.01); *H05K 2203/1563* (2013.01)

(58) Field of Classification Search
CPC .............. H05K 2203/0766; H05K 2203/1563; H05K 13/0061; H05K 3/0052; H05K 3/227
See application file for complete search history.

(56) References Cited

OTHER PUBLICATIONS

International Search Report and Written Opinion dated Nov. 15, 2018 for International Application No. PCT/SG2018/050401 (13 pages).

\* cited by examiner

UNIT UNLOADING SYSTEM

CROSS-REFERENCE TO RELATED APPLICATIONS

This application is a U.S. National Stage filing under 35 U.S.C. § 371 of International Application Serial No. PCT/SG2018/050401, filed Aug. 7, 2018, which claims the benefit of and priority to Singapore Patent Application No. 10201706437V, filed Aug. 7, 2017, which are both incorporated herein by reference in their entirety.

FIELD OF THE INVENTION

The invention relates to the processing of printed circuit boards (PCB's). In particular it relates to the separation of a PCB from a panel and subsequent processing.

BACKGROUND

In the processing of printed circuit boards (PCBs) being more complex devices, waste through rejection becomes a more expensive issue than the rejection of an integrated circuit having gone through a limited number of processing steps. For the printed circuit board the larger material costs is clearly an issue but further having more processes to build the PCBs up to the stage of later processing involves a longer manufacturing path and so rejection consequently represents a greater cost.

One aspect of rejection of a PCB is the damage caused by both sawing of the PCB as well as detritus from the sawing process interfering or damaging with such a unit. Given the higher cost during to rejection for a PCB, it is therefore important that during the sawing process such sources of rejection be minimized.

SUMMARY OF INVENTION

In a first aspect the invention provides a method for washing a plurality of PCB units, the method comprising the steps of: receiving a plurality of PCB units, said PCB units arranged with a bump face projecting downwards; washing the bump face of the PCB units, then; flipping the PCB units so as to project a ball face downwards, then; washing the ball face.

In a second aspect the invention provides a washing station for washing a plurality of PCB units, comprising: a washing unit arranged to wash and de-burr the PCB units, and; a flipper for flipping the PCB units; wherein the washing unit is arranged to wash and de-burr one side of the PCB units, and the flipper is arranged to flip the PCB units so as to expose an opposite side of the PCB units, with the washing unit further arranged to was and de-burr the opposite side.

Consequently, the invention provides for both sides of a PCB to be washed and deburred, reducing rejection and wastage.

In a third aspect the invention provides an IC unit unloading system comprising: a chute intermediate a net table and an unloading zone, said chute having a plurality of channels, each channel arranged to receive a unit, and sized so as to allow a portion of the unit to project above a top surface of said chute; the channels, at a receiving end, having a first pitch and at an unloading end, having a second pitch, the first pitch being less than the second pitch; a drawer arranged to move along the chute from the receiving end to the unloading end, said drawer having a gate, said gate having a unit contact face positioned to be proximate to the top surface of the chute; said unit contact face arranged to contact the units and draw the units along the respective channel as the drawer moves along the chute; wherein the unit contact face is arranged to allow the units to slide laterally across the unit contact face so as to move from the first pitch to the second pitch.

In a fourth aspect the invention provides a method for unloading IC units, the method comprising the steps of: delivering said units to channels of a chute, said chute intermediate a net table and an unloading zone; a pitch of said channels varying from a first pitch to a second pitch from a receiving end to an unloading end, the first pitch being less than the second pitch; moving a drawer having a unit contact face along the chute from the receiving end to the unloading end; said unit contact face contacting the units and so; drawing the units along the respective channel by unit contact face; laterally moving the units in the channels from the first pitch to the second pitch.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

DETAILED DESCRIPTION

Figure 1:
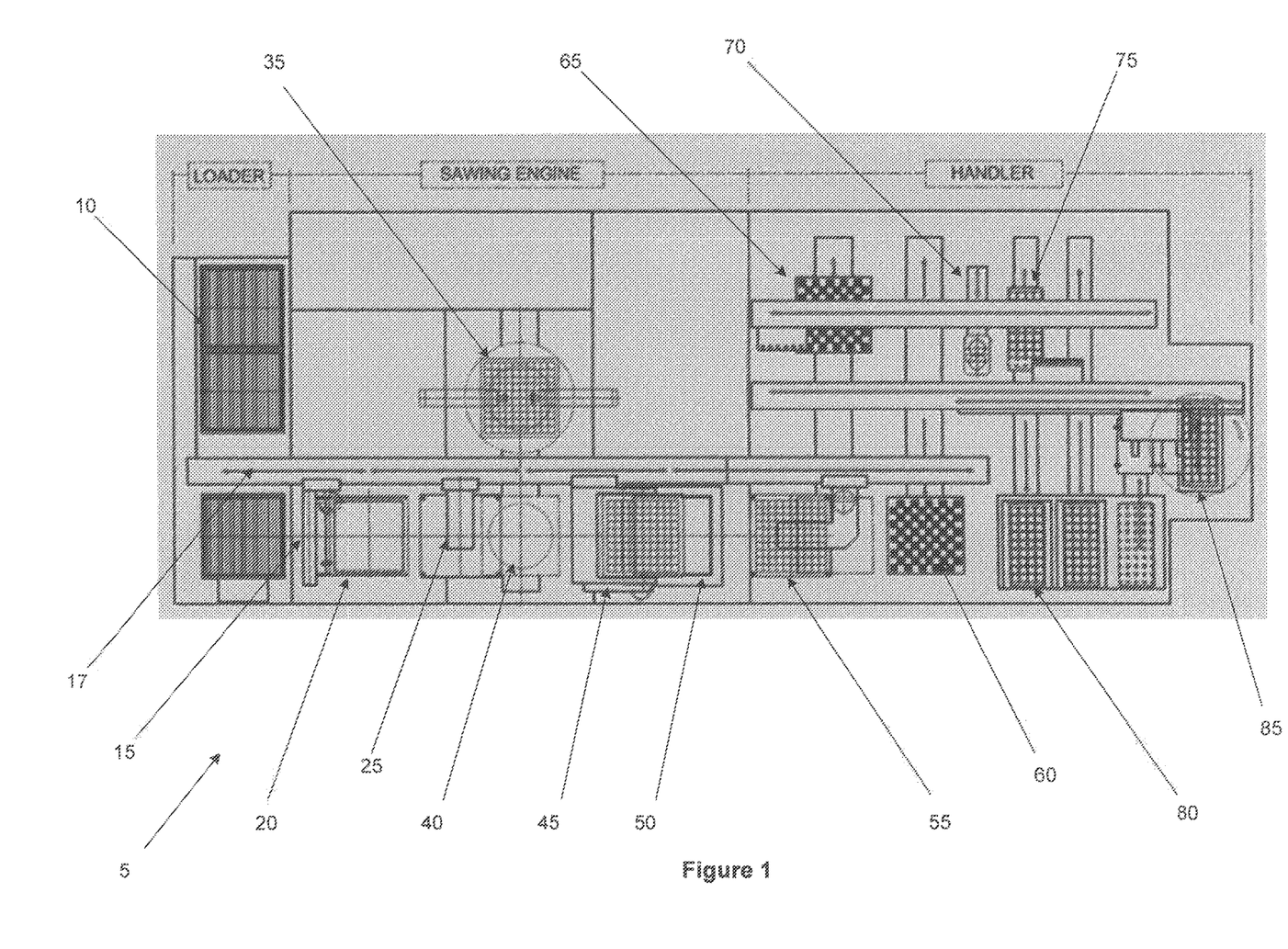
FIG. 1 is a plan view of the sawing and sorting device according to one embodiment of the present invention.
Figure 2:
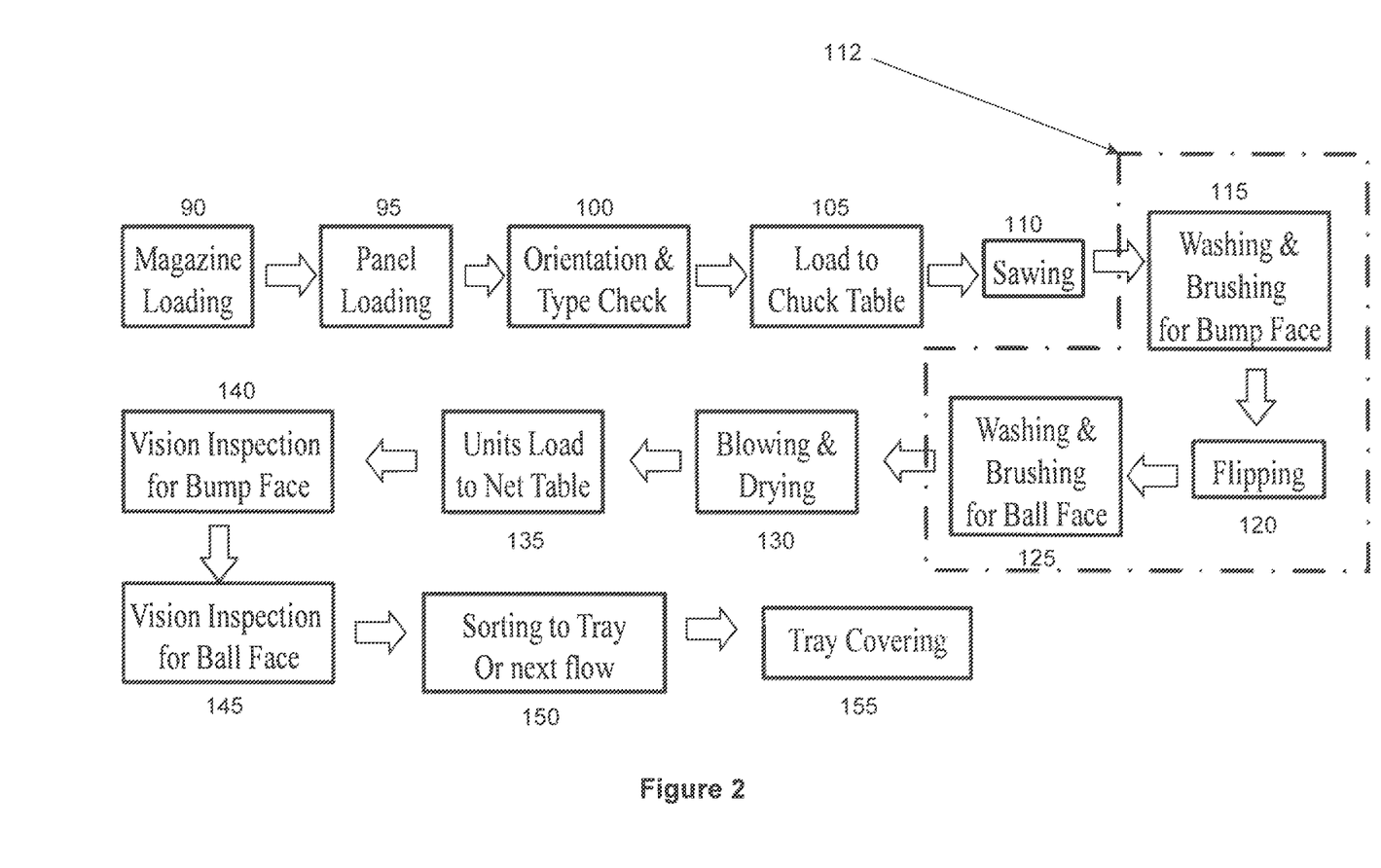
FIG. 2 is a flow chart for the flow of PCB panels through the sawing and sorting device according to a further embodiment of the present invention.

FIGS. 1 and 2 show a sawing and sorting device for PCBs. Here the device 5 includes a panel magazine 10, 90 for loading 95 PCB substrates into a loading station 20. The PCBs have been manufactured in large single panel with the device 5 arranged to dice the PCBs into separate units.

The PCB panels are loaded 95 by a pusher (not shown) onto a platform for inspection 100 by inspection device 15 running along a slide 17. The inspection checks the panel for orientation and other data so as to enter into the control system certain parameters such as the type of PCB, panel size, PCB size etc., for eventual use during sawing.

Once inspected, the panel is loaded 105 to a chuck table 40 by a panel engagement arm 25 running along the aforementioned slide 17. The panel is placed within the sawing zone 35 where a pair of saws dice 110 the panel into separate PCB units. In this embodiment the pair of saws is oriented along a common axis. Once the cut in the panel along that axis has been completed the panel is rotated by a turntable within the sawing zone 35 and the saws then complete the process by cutting along the orthogonal axis. The diced panel is then returned to the chuck table 40 whereupon the diced PCB units are delivered to the washing station 50.

A flipper 45 is arranged to engage the panel as a whole so as to prevent relative movement of the various diced PCBs. It is therefore capable of engaging the entire panel. Prior to the flipping process the panel is placed within the washing station 50 whereupon the first surface of the PCBs is washed and brushed 115 from underneath. The panel is subsequently flipped 120 so as to expose the opposite face whereupon the opposite surface is washed and brushed 125 from underneath. The panel is then delivered to the dry block 55 for blow drying 130 and removal of any detritus still adhering to the panel.

The individual PCB units are delivered 135 to the net table 60 whereupon the ball face of each PCB is inspected 140 from underneath and the bump face inspected 145 from above. The PCB units are then individually picked and delivered 150 to the handler 65 which sorts 70 the various PCBs into the various trays 80 including removing 75 any failing the previous inspections.

The trays 80 into which the PCB units are sorted 150 are then subsequently packaged 155 with tray coverings and sent to the unloading zone 85 for eventual removal from device 5.

A particular feature of the process is the washing cycle 112 which ensures that both sides of the PCB are deburred and cleaned prior to unloading. Because of the aforementioned problems in the prior art in being able to flip a singulated PCB panel, only one side is cleaned and deburred which occurs during the sawing cycle. The washing cycle 112 according to one embodiment of the present invention differs from the prior art in firstly loading the panel with the bump face down and dicing the panel in this orientation. Because the first washing step is applied directly after sawing in the washing station 50, the bump face is therefore washed first with the panel then flipped 120 allowing for the ball face to then be washed 125 before progressing through drying and subsequently to unloading. Accordingly, the present invention according to this embodiment reduces rejection as well as customer end waste through fully cleaning the PCBs away from the dicing centre and on both faces.

Figure 3:
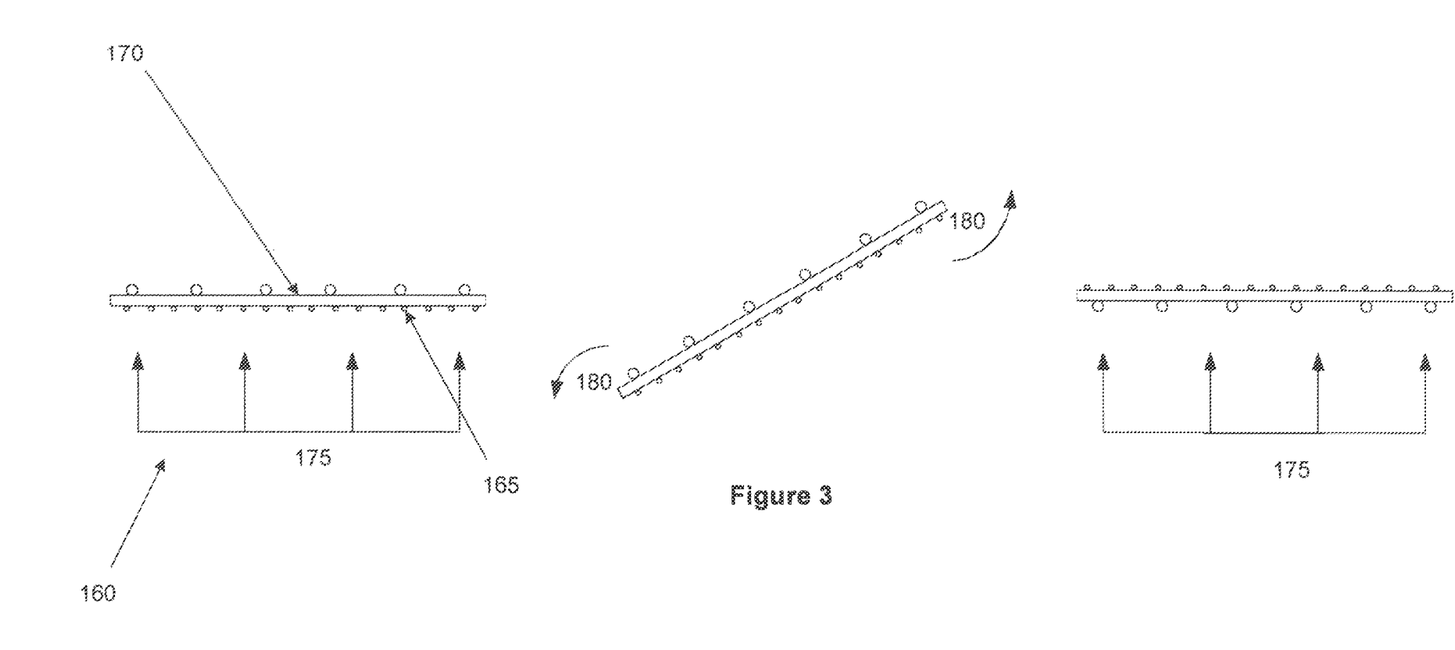
FIG. 3 is a schematic view of a washing cycle according to a further embodiment of the present invention.

FIG. 3 shows a schematic view of the washing cycle according to one embodiment of the present invention. A PCB 160 is received by the washing station with the ball face 165 projecting upwards and the bump face 170 projecting downwards. The bump face is subjected to a washing and deburring process 175 and, on completion, the PCB 160 is flipped 180 so as to expose the ball face. In a final step of the washing cycle the washing and deburring process 175 is completed on the ball face whereupon the PCB 160 is then delivered to drying and other downstream stations.

FIGS. 4 to 9 show an integrated circuit (IC) unit unloading system 200 for the distribution of units following singulation, washing and/or inspection. The unit unloading system may be applicable to a range of unit handling systems. The system 200 is consequently not bound by the upstream processes, other than it may be applicable for the distribution of units from a net table. Accordingly, the invention relates to the delivery of units from a net table to an unloading zone.

The net table in the current system is translated from the upstream processes, such as along a lateral slide (not shown). Alternatively, the net table may receive units from upstream via a unit picker which deposits the units on the table 205.

The units are pushed in groups, such as 6 per group, by a gang pusher 235, having a rubber prong corresponding to each unit, in the current embodiment 6 prongs. The prongs simultaneously push 245 the units 255 onto a delivery chute 210. The gang pusher may include a cover 240 positioned over the units being pushed, to ensure the units do not buckle and bulge on the application of the pushing force. The gang pusher 240 further includes an overload sensor, such that if the units stick, or otherwise do not freely move into the chute 210, the gang pusher is stopped by a signal sent from the overload sensor, preventing damage to the units.

On delivery 245 of the units to the chute 210, the gang pusher is withdrawn to the starting position, and the net table shifted to align the next unit group with the channels 211 of the chute for the delivery 245 of the next group. It will be noted that the channel is sized so as to allow a portion of the units to project from the channels 211.

Figure 7:
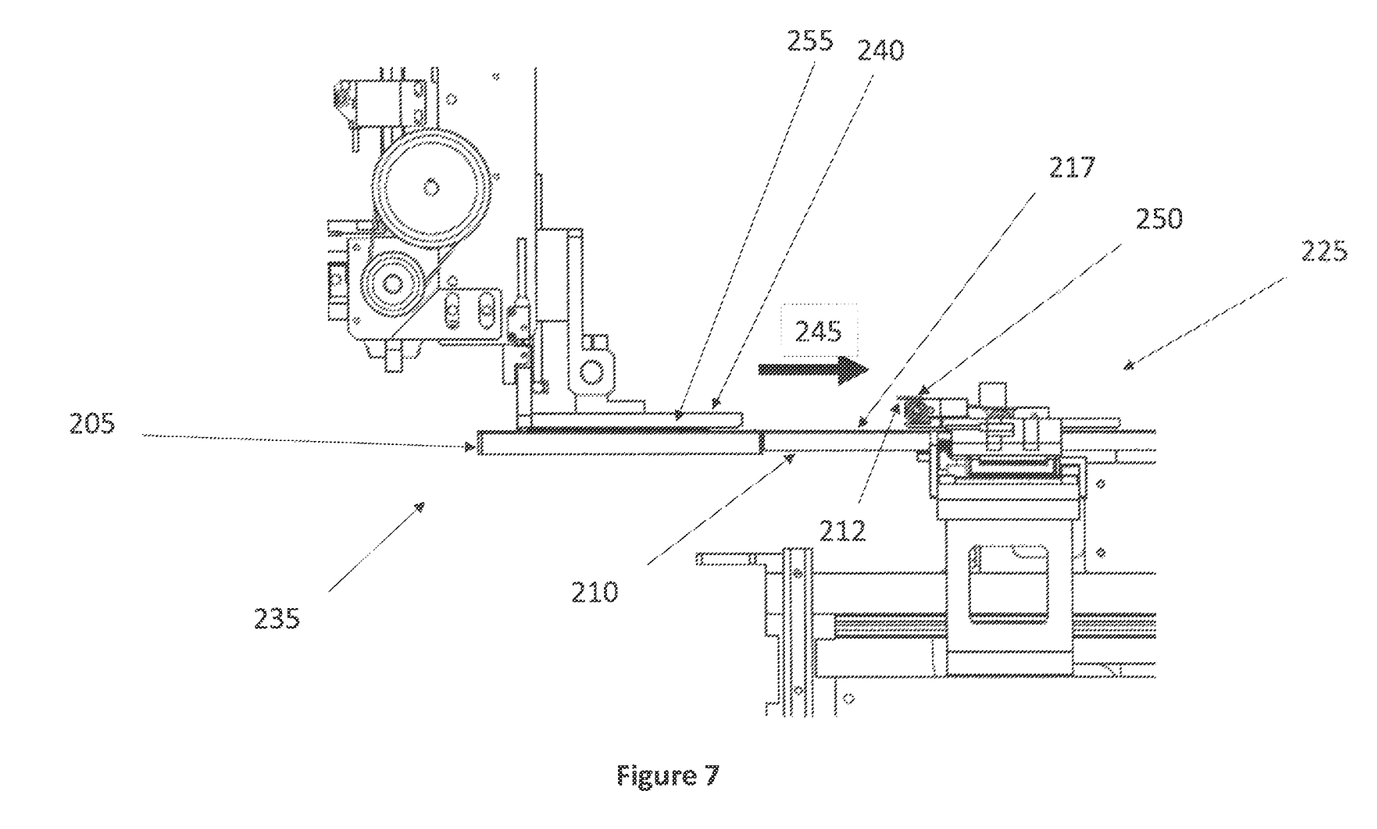
FIG. 7 is an elevation view of the unit pusher system of FIG. 6.
Figure 8:
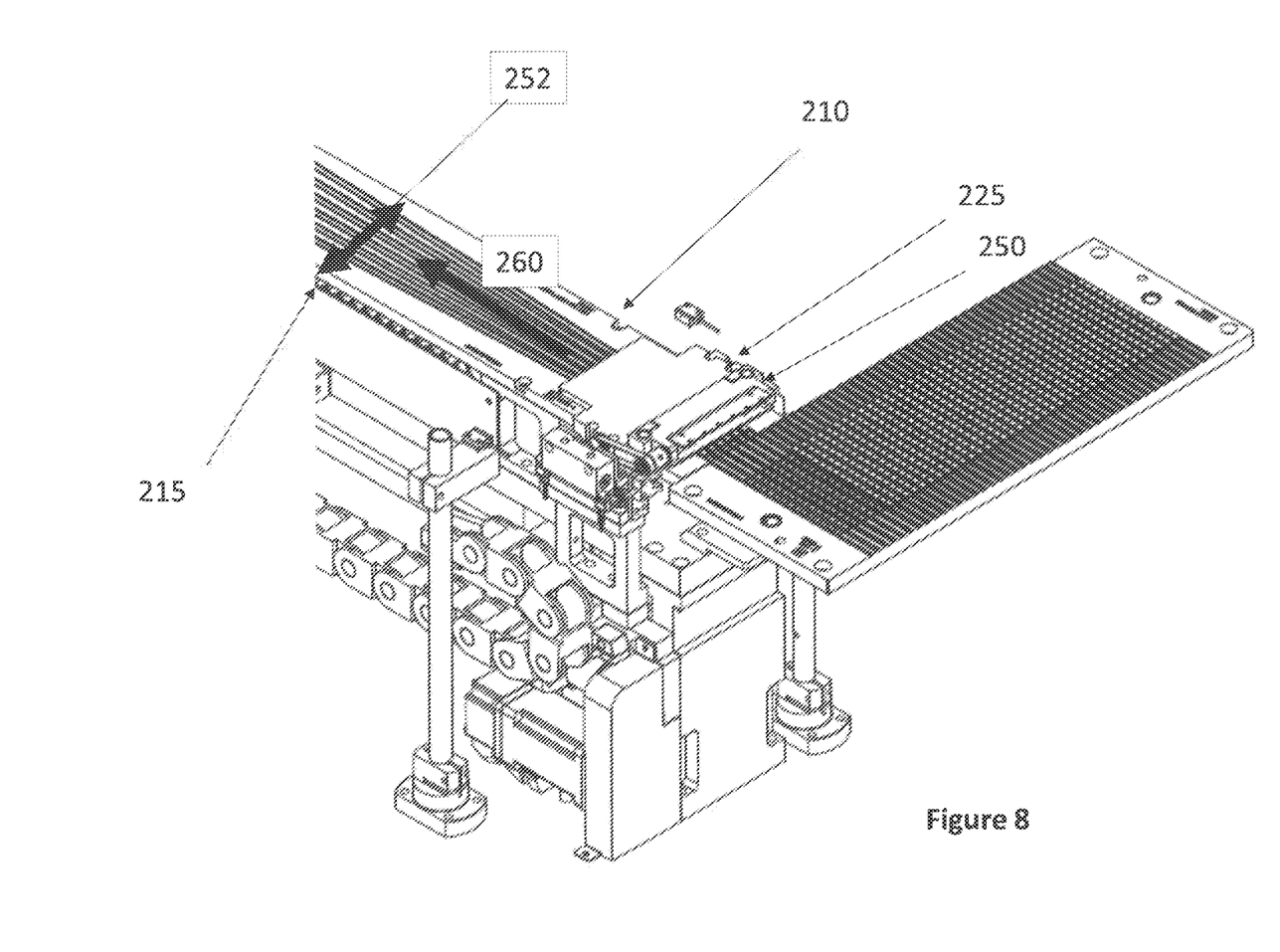
FIG. 8 is an isometric view of a unit drawer system according to a further embodiment of the present invention.

At this point, the drawer 225 moves to the proximate end of the chute 210. As shown in FIGS. 7 and 8, as the drawer moves back, the gate 250 is open so as to be clear of the chute 210. On reaching the proximate end, the gate 250 closes, bringing a unit contact face 212 of the gate proximate to a top surface 217 of the chute. The drawer then moves forward away from the gang pusher, with the unit contact face 212 drawing 260 the units along with the drawer along the chute. The drawer 225 further includes a cover to prevent displacement of the units as they are drawn forward. The drawer 225 further includes an overload sensor, similar to the gang pusher.

Figure 4:
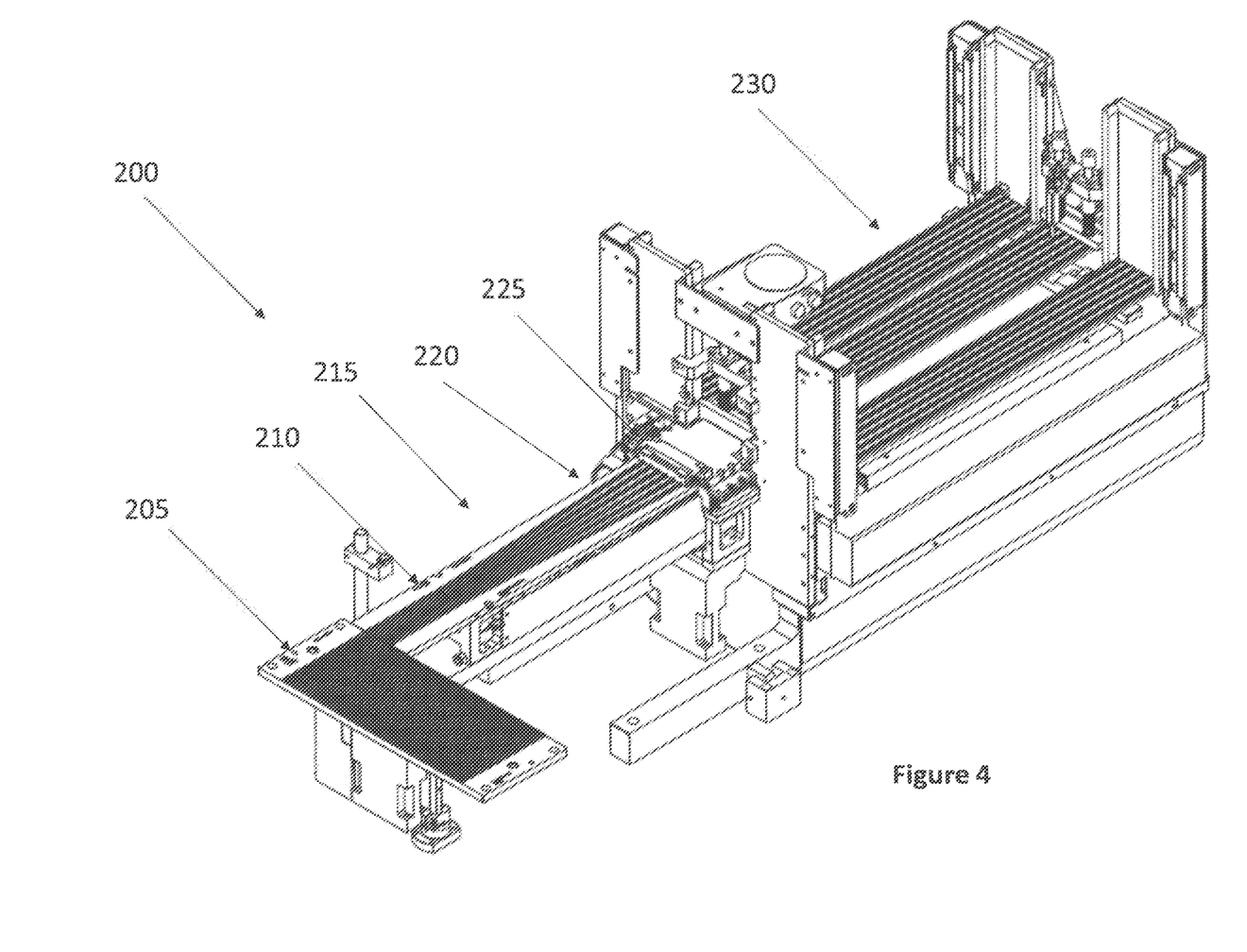
FIG. 4 is an isometric view of a unit unloading system according to a further embodiment of the present invention.
Figure 5:
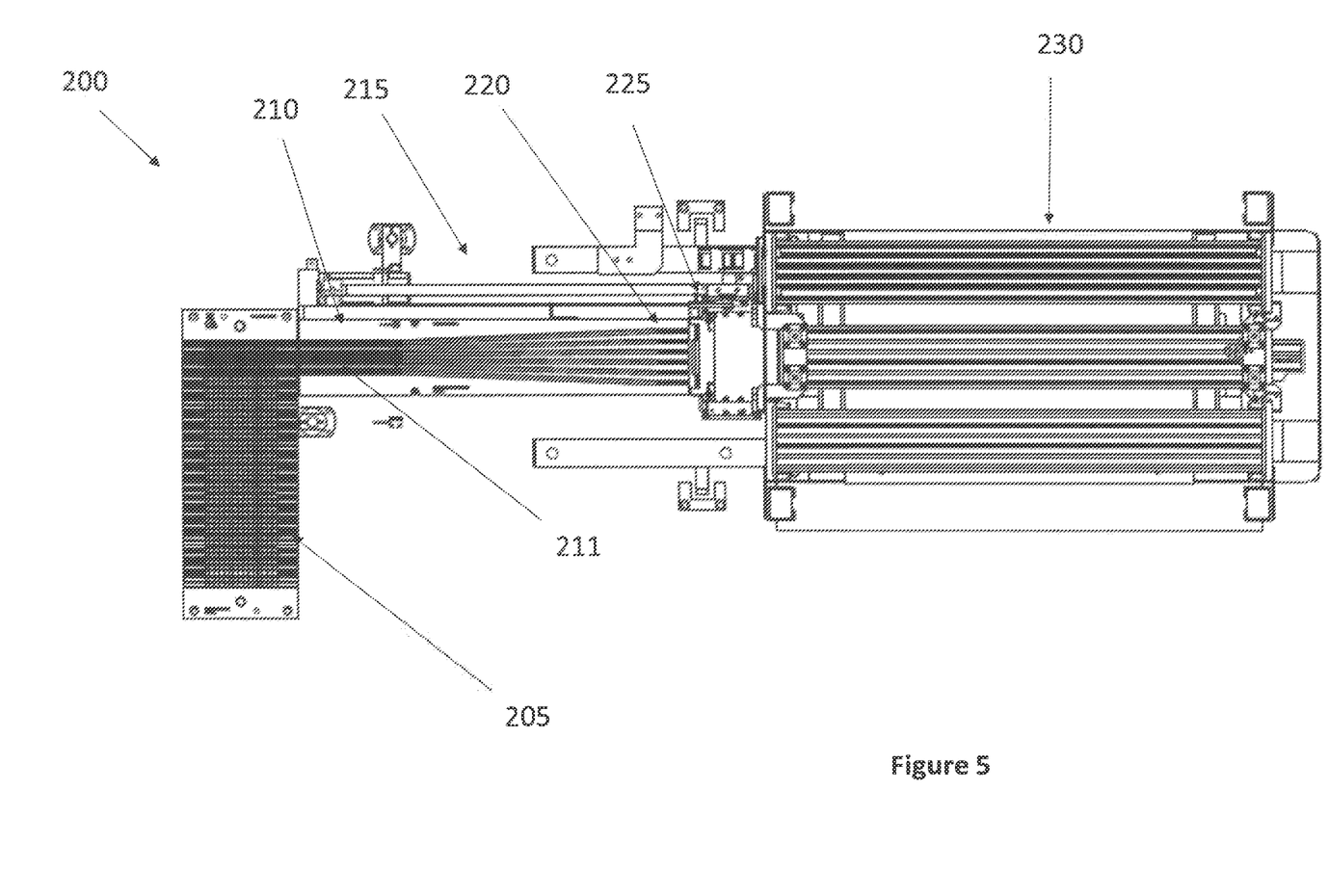
FIG. 5 is a plan view of the unit unloading system of FIG. 4.

It will be noted that the channels of the chute are not spaced uniformly, but are spaced by a first pitch before a transition 215 whereby the spacing between the channels widens to a second pitch. The second pitch 220 of the channels at the end 290 of the chute corresponds to the end cassettes 230 into which the units are eventually delivered for subsequent unloading. Thus the drawer must adapt from the first pitch for which the units are received to a second pitch corresponding to the cassettes 230.

The drawer achieves this by allowing to the unit to slide laterally 252 along the unit contact face of the gate, as the drawer passes through the transition 215.

Figure 9:
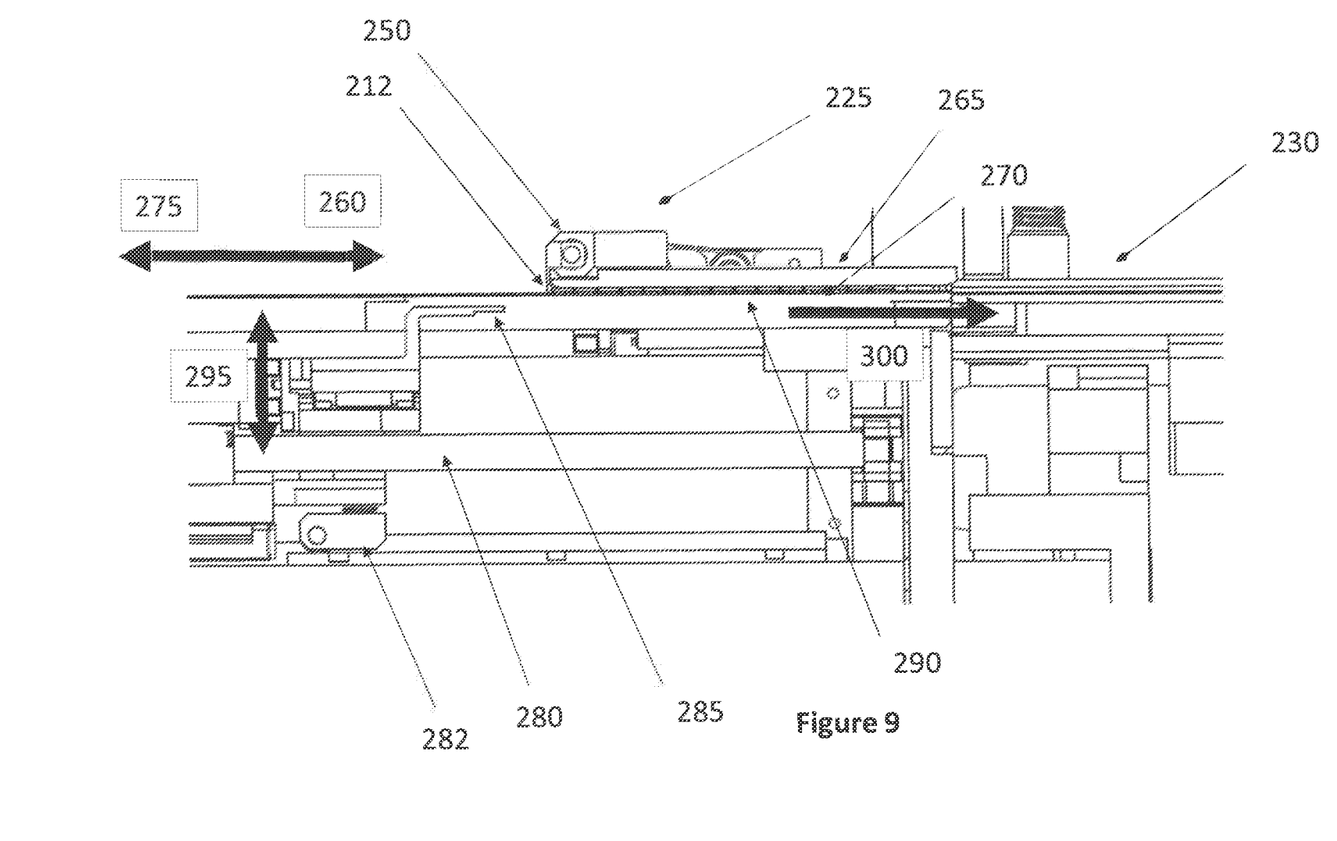
FIG. 9 is an elevation view of the unit drawer system of FIG. 8.

As mentioned, at the end of the chute, the gate 250 of the drawer 225 opens, and the drawer returns to receive the next batch of units.

Figure 6:
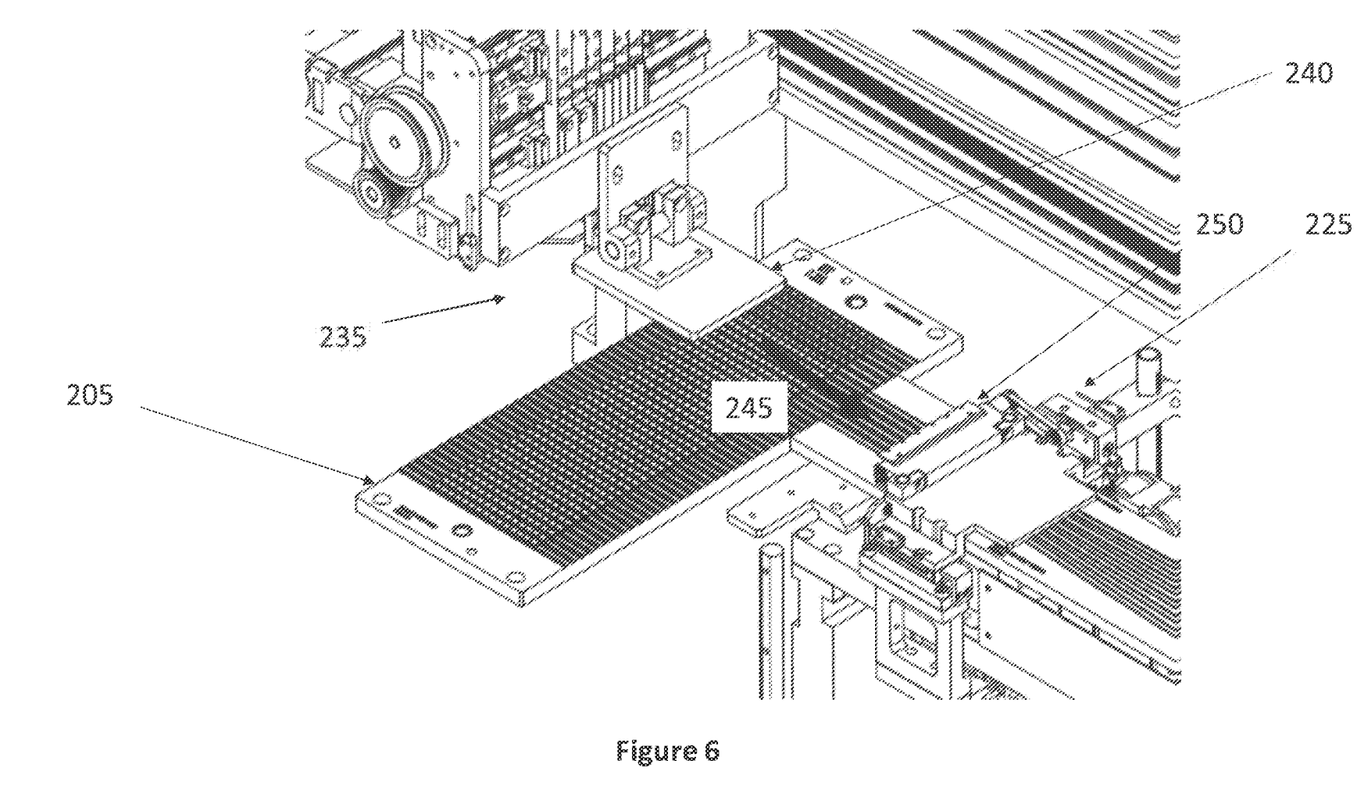
FIG. 6 is an isometric view of a unit pusher system according to a further embodiment of the present invention.

The units 270 are now located at the end 290 of the chute ready for delivery to the unloading zone, having the cassettes 230 ready to receive said units. At this point, the final pusher 280 commences to move forward. At the commencement of movement, the prongs 285 of the final pusher are below the channels. As the final pusher moves, a roller 282 encounters a cam which raises the final pusher 280 to align the prongs 285 with the channels, so as to apply a force to the units 275, and push 300 the units into the cassettes 230.

The final pusher then withdraws, ready to receive units from the drawer.

The invention claimed is:
1. An IC unit unloading system comprising:
a chute intermediate a net table and an unloading zone, said chute having a plurality of channels, each channel arranged to receive a unit, and sized so as to allow a portion of the unit to project above a top surface of said chute;

the channels, at a receiving end, having a first pitch and at an unloading end, having a second pitch, the first pitch being less than the second pitch;

a drawer arranged to move along the chute from the receiving end to the unloading end, said drawer having a gate, said gate having a unit contact face positioned to be proximate to the top surface of the chute;

said unit contact face arranged to contact the units and draw the units along the respective channel as the drawer moves along the chute;

wherein the unit contact face is arranged to allow the units to slide laterally across the unit contact face so as to move from the first pitch to the second pitch; and wherein the gate is arranged to move from an open position, whereby the unit contact face is distal from the chute, and a closed position whereby the unit contact face is arranged to contact the units.

2. The IC unit unloading system according to claim 1, further including a gang pusher, said gang pusher arranged to push units from a table into said chute, said gang pusher including a plurality of prongs, each prong corresponding to a channel of said chute.

3. The IC unit unloading system according to claim 1, further including a final pusher, said final pusher located proximate to the loading end and arranged to push units from the chute into the loading zone.

4. The IC unit unloading system according to claim 3, wherein the final pusher is arranged to move along a rail, said rail including a cam, such that the final pusher is at a first level prior to said cam and a second level after said cam, said second level corresponding to prongs of said final pusher corresponding with channels of said chute.

5. The IC unit loading system according to claim 1, wherein the chute includes a transition such that the pitch of said channels varies from the first pitch to the second pitch within said transmission.

\* \* \* \* \*